United States Patent
Fujiwara et al.

(10) Patent No.: US 7,076,006 B2
(45) Date of Patent: Jul. 11, 2006

(54) DATA REPRODUCING METHOD AND DEVICE REPRODUCING DATA ACCORDING TO A VITERBI DECODING ALGORITHM USING AN AVERAGE VALUE OF A REPRODUCTION SIGNAL

(75) Inventors: Toru Fujiwara, Kato (JP); Masakazu Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 952 days.

(21) Appl. No.: 09/901,981

(22) Filed: Jul. 10, 2001

(65) Prior Publication Data

US 2002/0129319 A1    Sep. 12, 2002

(30) Foreign Application Priority Data

Mar. 7, 2001 (JP) ............................. 2001-063895

(51) Int. Cl.
*H03D 1/00* (2006.01)

(52) U.S. Cl. ................. 375/341; 369/59.22; 369/53.35; 714/795

(58) Field of Classification Search ................. 375/232, 375/263, 350, 341, 327, 355; 708/323; 714/752, 714/795; 369/59.22, 1, 124.01, 47.35, 59.21, 369/124.05, 53.35, 31, 54, 59, 47, 124, 59.2
See application file for complete search history.

(56) References Cited

U.S. PATENT DOCUMENTS

| | | | | |
|---|---|---|---|---|
| 5,506,827 A | * | 4/1996 | Tobita | 369/59.22 |
| 5,508,993 A | * | 4/1996 | Hayashi et al. | 369/59.22 |
| 5,566,155 A | * | 10/1996 | Hayashi | 369/59.22 |
| 6,603,722 B1 | * | 8/2003 | Taguchi et al. | 369/59.21 |
| 6,614,841 B1 | * | 9/2003 | Ohta | 375/232 |
| 6,618,337 B1 | * | 9/2003 | Miyashita et al. | 369/53.35 |
| 6,674,707 B1 | * | 1/2004 | Ogura et al. | 369/59.22 |
| 6,674,816 B1 | * | 1/2004 | Shieh | 375/341 |
| 6,807,134 B1 | * | 10/2004 | Nakajima et al. | 369/47.35 |
| 6,819,724 B1 | * | 11/2004 | Hayami et al. | 375/341 |
| 6,826,722 B1 | * | 11/2004 | Miyauchi et al. | 714/752 |
| 6,836,511 B1 | * | 12/2004 | Marukawa | 375/232 |

FOREIGN PATENT DOCUMENTS

JP    07262694 A    10/1995

(Continued)

OTHER PUBLICATIONS

Low power techniques and design tradeoffs in adaptive FIR filtering for PRML read channels Muhammad, K. et al; Low Power Electronics and Design, 2000. ISLPED '00. Proceedings of the 2000 International Symposium on Jul. 26-27, 2000, pp. 262-267.*

(Continued)

*Primary Examiner*—Temesghen Ghebretinsae
(74) *Attorney, Agent, or Firm*—Greer, Burns & Crain, Ltd.

(57) ABSTRACT

A data reproducing method reproduces data corresponding to a state-transition pass selected as being most likely according to a Viterbi decoding algorithm from a reproduction signal supplied from a recording medium. The data reproducing method comprises the steps of detecting at least one state of the reproduction signal according to data used for selecting the state-transition pass, calculating an average value of the reproduction signal in the state detected by the step of detecting, and following a fluctuation amount of a direct current component of the reproduction signal according to the average value.

15 Claims, 12 Drawing Sheets

FOREIGN PATENT DOCUMENTS

| | | |
|---|---|---|
| JP | 09-007313 | 1/1997 |
| JP | 09245439 A | 9/1997 |
| JP | 09-330565 | 12/1997 |
| JP | 10172238 A | 6/1998 |

OTHER PUBLICATIONS

A 450 Mbit/s EPR4 PRML read/write channel; Demicheli, M. et al; Custom Integrated Circuits, 1999. Proceedings of the IEEE 1999 May 16-19, 1999 pp. 317-320.*

* cited by examiner

FIG.5
| COMBINATION OF CONDITIONS | (1) (EXPRESSION 11) PASS (EXPRESSION 13) MEMORY | (2) (EXPRESSION 12) PASS (EXPRESSION 13) MEMORY | (3) (EXPRESSION 11) PASS (EXPRESSION 14) MEMORY | (4) (EXPRESSION 12) PASS (EXPRESSION 14) MEMORY |
|---|---|---|---|---|
| TRELLIS DIAGRAM | 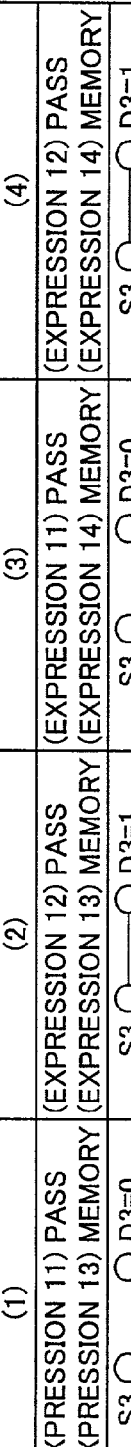 | 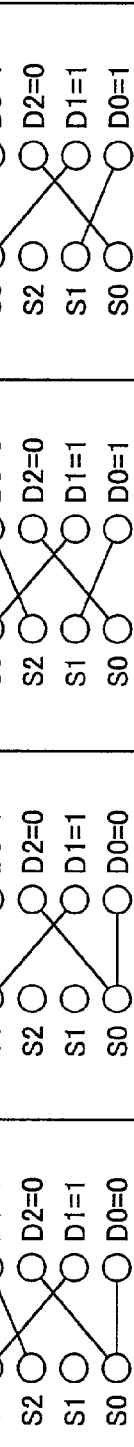 |  |  |

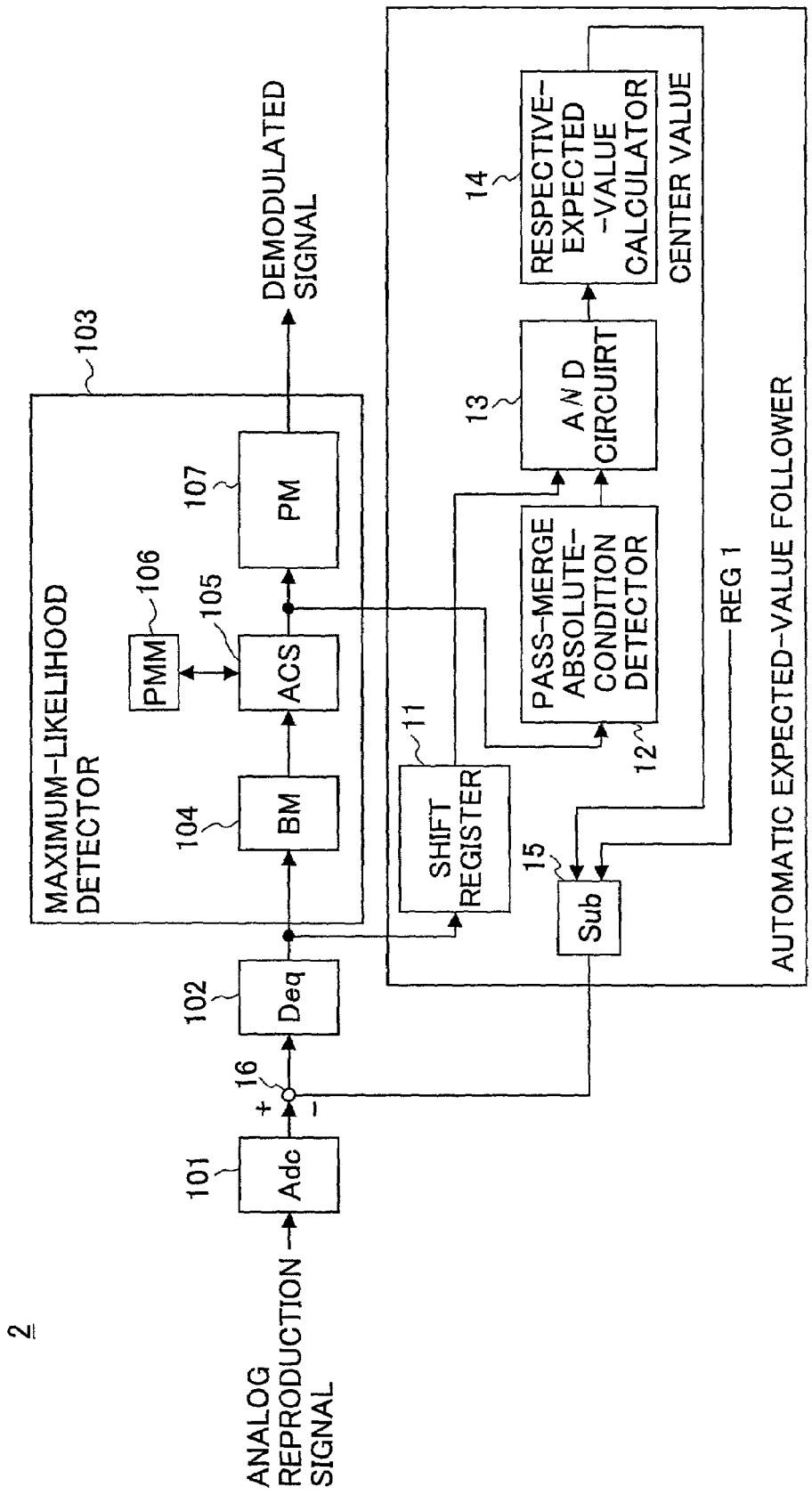

DATA REPRODUCING METHOD AND DEVICE REPRODUCING DATA ACCORDING TO A VITERBI DECODING ALGORITHM USING AN AVERAGE VALUE OF A REPRODUCTION SIGNAL

BACKGROUND OF THE INVENTION

1. Field of the Invention

The present invention generally relates to a data reproducing method, a data reproducing device and a magneto-optical disk device, more particularly, to a data reproducing method, a data reproducing device and a magneto-optical disk device which use a partial-response/maximum-likelihood (PRML) detecting method.

2. Description of the Related Art

For example, a magneto-optical disk device has been implemented into various fields such as in recording and reproduction of picture/image information and in recording and reproduction of various sorts of code data for computers, due to its high capacity, low cost and high reliability. Such a magneto-optical disk device is expected to have an even higher capacity; accordingly, this requires a data reproducing method that can with high accuracy reproduce data recorded with high density.

There is a method for reproducing data with high accuracy including the processes of recording data in a magneto-optical disk by modulating the data into a so-called partial response (PR) waveform, sampling signals reproduced from the magneto-optical disk at a predetermined interval, and thereafter detecting most likely data by a so-called Viterbi detector (a maximum-likelihood data detector).

For example, a data reproducing system of a magneto-optical disk device has enhanced its reproducing capability by calculating a fluctuation amount (hereinafter referrer to as an offset amount) of direct current components of reproduction signals of data being reproduced from a magneto-optical disk, and feeding back the calculated offset amount to an expected value of a PRML reproducing system.

FIG. 1 shows an example of a structure of a data reproducing system 100. In FIG. 1, an analog-to-digital converter 101 is supplied with an analog reproduction signal reproduced from a magneto-optical disk, for example, and then converts the analog reproduction signal into a digital signal. A digital equalizer 102 shapes the waveforms of the digital signal supplied from the analog-to-digital converter 101, and then supplies sampled values to a Viterbi detector (a maximum-likelihood detector) 103.

The Viterbi detector 103 detects recorded data from the sampled values of the analog reproduction signal supplied from the analog-to-digital converter 101 via the digital equalizer 102 according to a Viterbi decoding algorithm.

The sampled values of the analog reproduction signal are supplied to a branch-metric calculation unit (hereinafter referred to as a BM) 104 of the Viterbi detector 103. The BM 104 calculates a branch-metric value (hereinafter referred to as a BM value) that is a difference between each of sampled values yt supplied thereto and an expected value. The expected value is a value depending on a PR waveform, and is a value that the analog reproduction signal could essentially assume. The BM value is calculated for each expected value when the sampled value yt is supplied.

An add-compare-select unit (hereinafter referred to as an ACS) 105 adds each of the above-mentioned BM values to a pass-metric value (hereinafter referred to as a PM value) of one clock before that is stored in a pass-metric memory (hereinafter referred to as a PMM) 106, and compares every two PM values after the addition. Then, the ACS 105 selects the smaller of the every two PM values as a new PM value according to the comparison result, and then stores the selected PM value in the PMM 106. Selecting the smaller PM value in this way means selecting a state-transition pass. That is, the ACS 105 always selects a state-transition pass with the minimum PM value.

A pass memory (hereinafter referred to as a PM) 107 is supplied from the ACS 105 with data (binary data) corresponding to the passes selected as described above. The PM 107 shifts the data corresponding to each of the selected passes one by one, and in this course, weeds out data corresponding to each of unselected passes one by one. Then, the PM 107 outputs data corresponding to the surviving pass as a demodulated signal.

On the other hand, the ACS 105 supplies the selected PM values to a minimum-value selector 108. The minimum-value selector 108 selects the minimum PM value, and then supplies the selected PM value to an offset-amount detector 109. The offset-amount detector 109 calculates an offset amount according to the supplied PM value by using a sliding average method, for example. The data reproducing system 100 shown in FIG. 1 feeds back the calculated offset amount to the expected value of a PRML reproducing system by adding the calculated offset amount to the expected value and supplying the expected value including the offset amount to the BM 104.

FIG. 2 shows another example of a structure of the data reproducing system 100. In FIG. 2, the digital equalizer 102 shapes the waveforms of the digital signal supplied from the analog-to-digital converter 101, and then supplies sampled values to the Viterbi detector 103 and a comparator 111. The comparator 111 is supplied with not only the sampled values of the analog reproduction signal but also a total value of an offset amount from the offset-amount detector 109 and a threshold value.

The comparator 111 compares the sampled values supplied thereto with the total value of the offset amount and the threshold value, and then supplies the comparison results to a state detector 112. The state detector 112 judges the state of the sampled values on the basis of the comparison results supplied thereto, and then supplies the judgment results to the offset-amount detector 109 and a respective-expected-value calculator 113.

The respective-expected-value calculator 113 feeds back the offset amount to the expected value of a PRML reproducing system by calculating respective expected values according to the supplied judgment results and supplying the calculated respective expected values to the BM 104. It is noted that the offset-amount detector 109 calculates the offset amount according to the judgment results supplied from the state detector 112.

FIG. 3 shows still another example of a structure of the data reproducing system 100. In FIG. 3, the digital equalizer 102 shapes the waveforms of the digital signal supplied from the analog-to-digital converter 101, and then supplies sampled values to the Viterbi detector 103 and a shift register 114. The shift register 114 delays the sampled values of the analog reproduction signal by a predetermined time, and supplies the delayed to one terminal of an AND circuit 116.

On the other hand, the PM 107 outputs data corresponding to the surviving pass as a demodulated signal, and also supplies the demodulated signal to a state detector 115. The state detector 115 judges the state of the sampled values on the basis of the demodulated signal supplied thereto, and then supplies the judgment results to the other terminal of the AND circuit 116.

The AND circuit 116 calculates logical products of the sampled values supplied from the shift register 114 and the judgment results supplied from the state detector 115, and then supplies the calculation results to the respective-expected-value calculator 113. The respective-expected-value calculator 113 feeds back an offset amount to an expected value of a PRML reproducing system by calculating respective expected values according to the supplied calculation results and supplying the calculated respective expected values to the BM 104.

However, the data reproducing system 100 shown in FIG. 1 cannot correctly select the minimum PM value when the difference between a sampled value and an expected value is large. Therefore, the data reproducing system 100 shown in FIG. 1 problematically miscalculates an offset amount in some cases.

There is also a problem that the data reproducing system 100 shown in FIG. 2 has to have an augmented circuit scale for comparing a threshold value with a sampled value. Additionally, the data reproducing system 100 shown in FIG. 2 involves a problem that it is difficult to determine a threshold value since the threshold value itself is required to follow an offset amount.

The data reproducing system 100 shown in FIG. 3 suffers a problem that utilizing the demodulated signal output from the PM 107 entails a delay corresponding to the time required to perform the process in the PM 107 so as to delay the feedback to the expected value. In addition, since the data reproducing system 100 shown in FIG. 3 uses the demodulated signal output from the PM 107, the data reproducing system 100 requires the shift register 114 for delaying the sampled values. Therefore, there is also a problem that the data reproducing system 100 shown in FIG. 3 has to have an enlarged circuit scale.

SUMMARY OF THE INVENTION

It is a general object of the present invention to provide an improved and useful data reproducing method, a data reproducing device and a magneto-optical disk device in which the above-mentioned problems are eliminated.

A more specific object of the present invention is to provide a data reproducing method, a data reproducing device and a magneto-optical disk device which are able to calculate an accurate offset amount without increasing a circuit scale of a data reproducing system, and are able to have an expected value of a PRML reproducing system immediately follow a fluctuation amount (the offset amount) of direct current components.

In order to achieve the above-mentioned objects, there is provided according to one aspect of the present invention a data reproducing method for reproducing data corresponding to a state-transition pass selected as being most likely according to a Viterbi decoding algorithm from a reproduction signal supplied from a recording medium, the method comprising the steps of:

detecting at least one state of the reproduction signal according to data used for selecting the state-transition pass;

calculating an average value of the reproduction signal in the state detected by the step of detecting; and following a fluctuation amount of a direct current component of the reproduction signal according to the average value.

Additionally, in the data reproducing method according to the present invention, the step of detecting may include the steps of:

outputting data supplied to a pass memory of a Viterbi detector as the data used for selecting the state-transition pass; and producing a state signal indicating the above-mentioned state according to the data used for selecting the state-transition pass.

Additionally, in the data reproducing method according to the present invention, the step of calculating may include the steps of:

judging the above-mentioned state according to the state signal; and calculating the average value of the reproduction signal in the state judged by the step of judging.

Additionally, in the data reproducing method according to the present invention, the step of following may include the steps of:

determining at least one expected value according to the average value, the expected value being used in the Viterbi decoding algorithm; and supplying the expected value to a Viterbi detector.

Additionally, in the data reproducing method according to the present invention, the step of following may include the step of:

adjusting the fluctuation amount of the direct current component according to the average value.

Additionally, in the data reproducing method according to the present invention, the above-mentioned state may be one of a peak portion, a center portion and a bottom portion of the reproduction signal.

The data reproducing method according to the present invention detects at least one state (such as a peak portion, a center portion or a bottom portion) of a reproduction signal according to data used for selecting a state-transition pass, and then calculates an average value of the reproduction signal in such a state so as to calculate a fluctuation amount of a direct current component of the reproduction signal. That is, since the data reproducing method according to the present invention does not detect a state of the reproduction signal according to data corresponding to a state-transition pass selected as being most likely, the data reproducing method can quickly calculate a fluctuation amount of a direct current component of the reproduction signal. In addition, since the data reproducing method according to the present invention detects at least one state of a reproduction signal according to data used for selecting a state-transition pass, the data reproducing method can calculate an accurate offset amount without increasing a circuit scale of a data reproducing system.

In order to achieve the above-mentioned objects, there is also provided according to another aspect of the present invention a data reproducing device for reproducing data corresponding to a state-transition pass selected as being most likely according to a Viterbi decoding algorithm from a reproduction signal supplied from a recording medium, the device comprising:

a condition detector detecting at least one state of the reproduction signal according to data used for selecting the state-transition pass;

an average circuit calculating an average value of the reproduction signal in the state detected by the condition detector; and a follower following a fluctuation amount of a direct current component of the reproduction signal according to the average value.

Additionally, in the data reproducing device according to the present invention, the condition detector may be supplied with data supplied to a pass memory of a Viterbi detector as the data used for selecting the state-transition pass so as to produce a state signal indicating the above-mentioned state according to the data used for selecting the state-transition pass.

Additionally, in the data reproducing device according to the present invention, the average circuit may judge the above-mentioned state according to the state signal so as to calculate the average value of the reproduction signal in the state.

Additionally, in the data reproducing device according to the present invention, the follower may determine at least one expected value according to the average value, the expected value being used in the Viterbi decoding algorithm, so as to supply the expected value to a Viterbi detector.

Additionally, in the data reproducing device according to the present invention, the follower may adjust the fluctuation amount of the direct current component according to the average value.

Additionally, in the data reproducing device according to the present invention, the above-mentioned state may be one of a peak portion, a center portion and a bottom portion of the reproduction signal.

The data reproducing device according to the present invention detects at least one state (such as a peak portion, a center portion or a bottom portion) of a reproduction signal according to data used for selecting a state-transition pass, and then calculates an average value of the reproduction signal in such a state so as to calculate a fluctuation amount of a direct current component of the reproduction signal. That is, since the data reproducing device according to the present invention does not detect a state of the reproduction signal according to data corresponding to a state-transition pass selected as being most likely, the data reproducing device can quickly calculate a fluctuation amount of a direct current component of the reproduction signal. In addition, since the data reproducing device according to the present invention detects at least one state of a reproduction signal according to data used for selecting a state-transition pass, the data reproducing device can calculate an accurate offset amount without increasing a circuit scale of a data reproducing system.

In order to achieve the above-mentioned objects, there is also provided according to still another aspect of the present invention a magneto-optical disk device for reproducing data according to a state-transition pass selected as being most likely according to a Viterbi decoding algorithm from a reproduction signal supplied from a recording medium having data recorded according to a partial-response waveform, the device comprising:

a condition detector detecting at least one state of the reproduction signal according to data used for selecting the state-transition pass, the data being supplied from a Viterbi detector;

an average circuit calculating an average value of the reproduction signal in the state detected by the condition detector; and a follower following a fluctuation amount of a direct current component of the reproduction signal according to the average value.

The magneto-optical disk device according to the present invention detects at least one state (such as a peak portion, a center portion or a bottom portion) of a reproduction signal according to data used for selecting a state-transition pass, and then calculates an average value of the reproduction signal in such a state so as to calculate a fluctuation amount of a direct current component of the reproduction signal. That is, since the magneto-optical disk device according to the present invention does not detect a state of the reproduction signal according to data corresponding to a state-transition pass selected as being most likely, the magneto-optical disk device can quickly calculate a fluctuation amount of a direct current component of the reproduction signal. In addition, since the magneto-optical disk device according to the present invention detects at least one state of a reproduction signal according to data used for selecting a state-transition pass, the magneto-optical disk device can calculate an accurate offset amount without increasing a circuit scale of a data reproducing system.

Other objects, features and advantages of the present invention will become more apparent from the following detailed description when read in conjunction with the accompanying drawings.

BRIEF DESCRIPTION OF THE DRAWINGS

FIG. 5 is an illustration for explaining examples of merge conditions produced by combinations of conditions;

FIG. 12 shows a structure of a data reproducing system according to another embodiment of the present invention.

DETAILED DESCRIPTION OF THE PREFERRED EMBODIMENTS

A description will now be given, with reference to the drawings, of embodiments according to the present invention.

Figure 1:
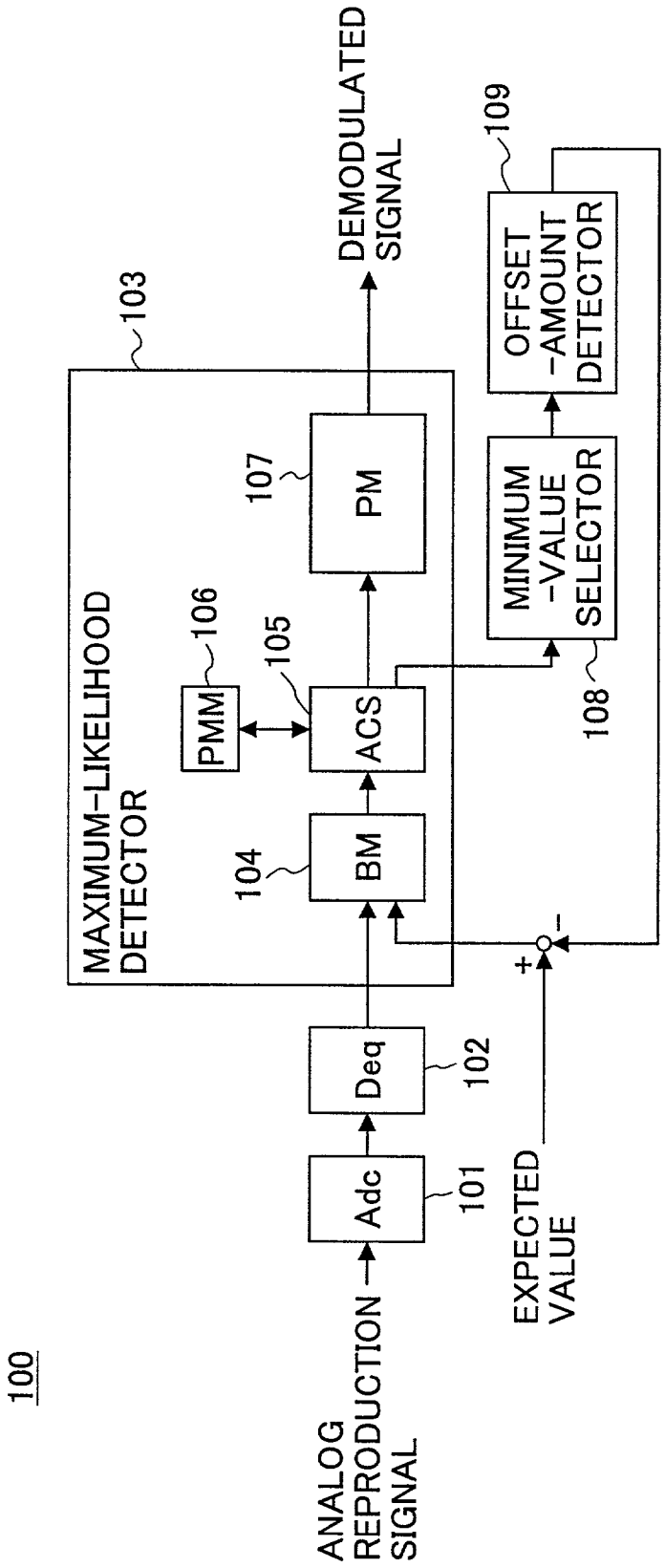
FIG. 1 shows an example of a structure of a data reproducing system.
Figure 2:
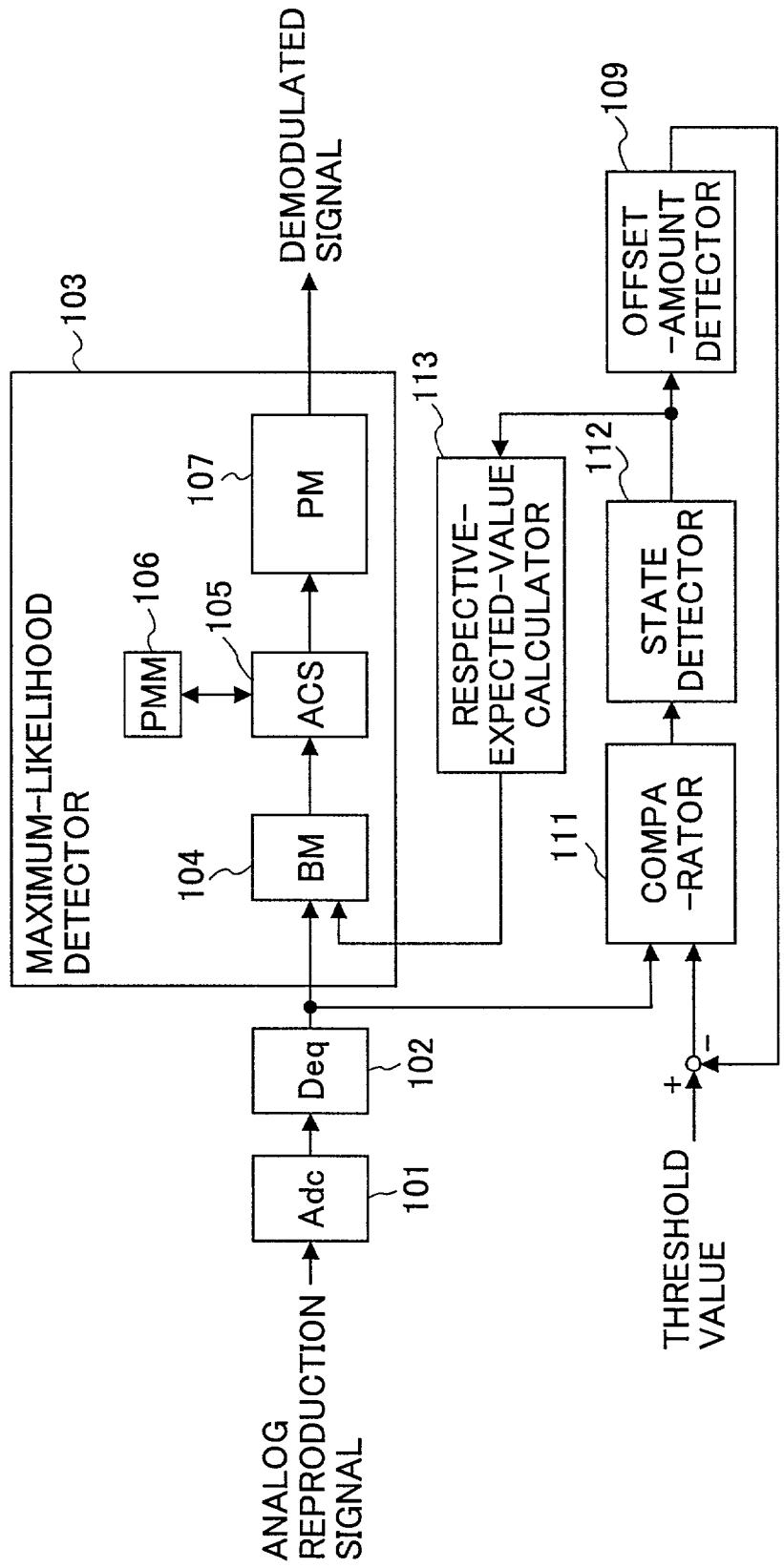
FIG. 2 shows another example of a structure of the data reproducing system.
Figure 3:
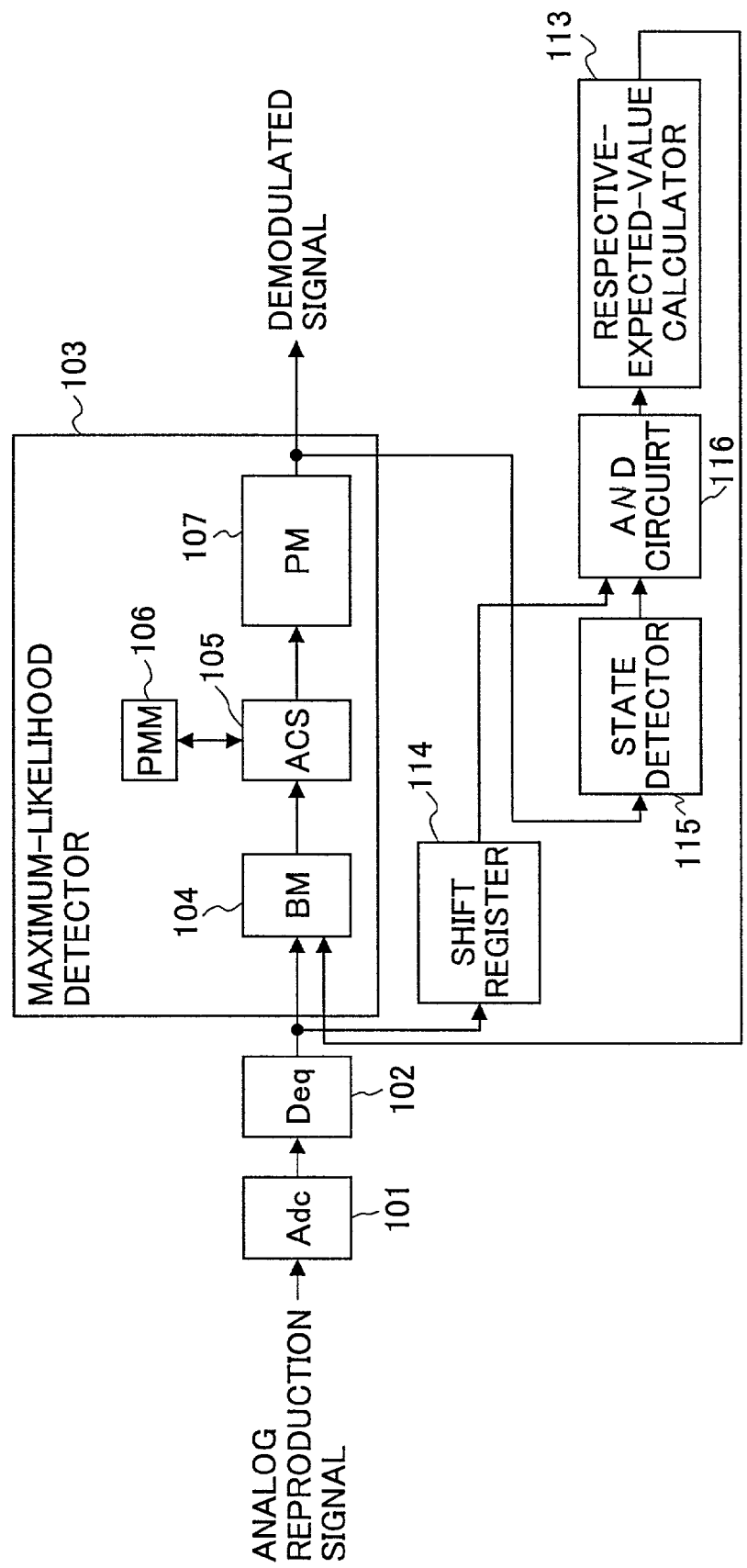
FIG. 3 shows still another example of a structure of the data reproducing system.
Figure 4:
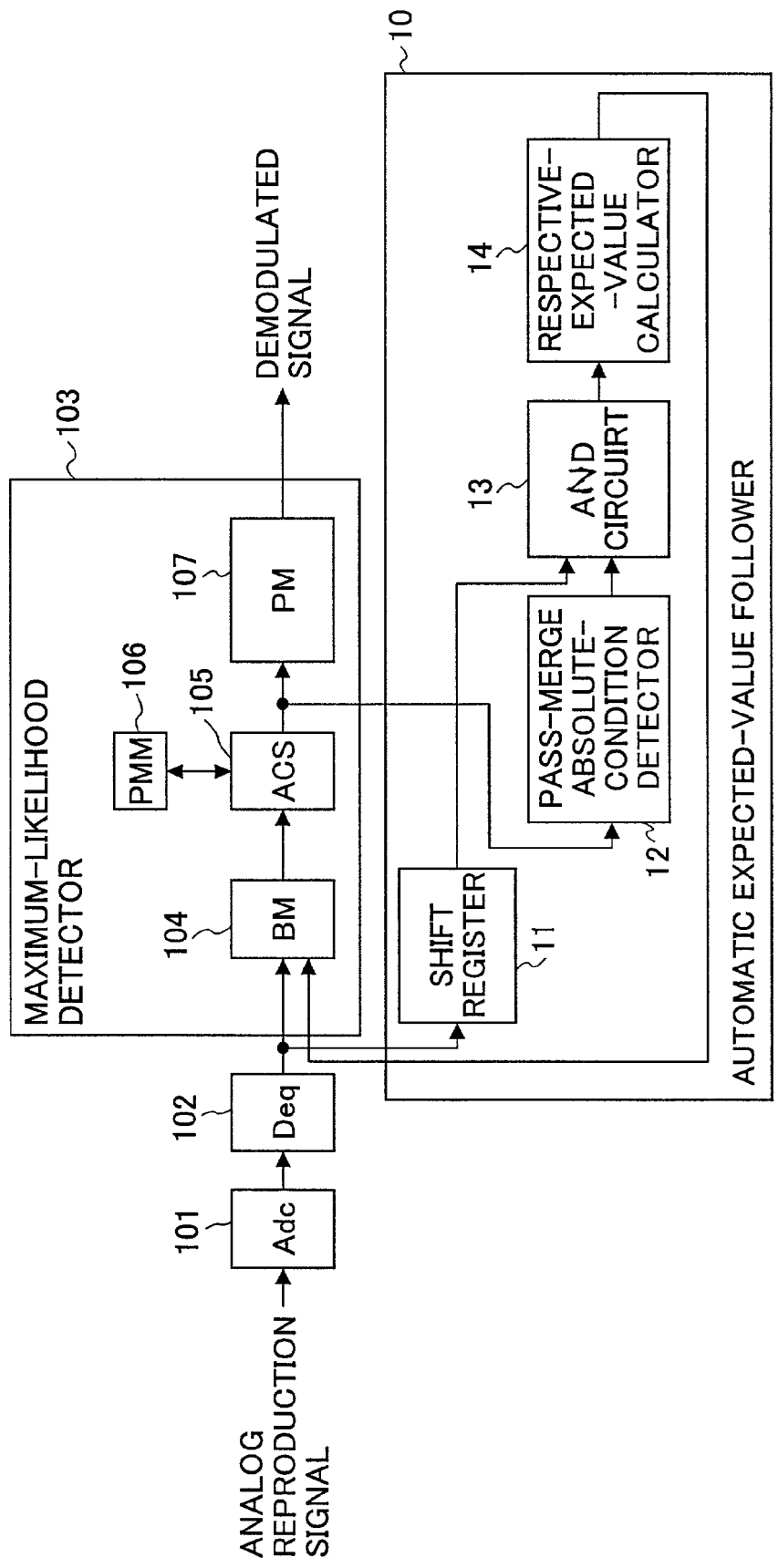
FIG. 4 shows a structure of a data reproducing system according to an embodiment of the present invention.

FIG. 4 shows a structure of a data reproducing system according to an embodiment of the present invention. A data reproducing system 1 shown in FIG. 4 comprises the analog-to-digital converter (Adc) 101, the digital equalizer (Deq) 102, the Viterbi detector 103, and an automatic expected-value follower 10. For example, an analog reproduction signal reproduced from a recording medium such as a magneto-optical disk via an optical head is supplied to the analog-to-digital converter 101. It is noted that the analog reproduction signal may be supplied to the analog-to-digital converter 101 after being amplified by an amplifier.

The analog-to-digital converter 101 operates in synchronization with a clock signal from a clock generating circuit not shown in the figure. Specifically, the analog-to-digital converter 101 samples the analog reproduction signal supplied thereto, and then outputs the sampled values yt of the analog reproduction signal in synchronization with the clock signal.

The sampled values yt output one by one from the analog-to-digital converter 101 in synchronization with the clock signal are supplied to the digital equalizer 102. The digital equalizer 102 equalizes the waveforms of the sampled values yt into PR (1,1), and then supplies the sampled values yt having the equalized waveforms to the Viterbi detector 103. The Viterbi detector 103 outputs demodulated signal from the sampled values supplied thereto one by one according to a Viterbi decoding algorithm.

The Viterbi detector 103 comprises the BM 104, the ACS 105, the PMM 106 and the PM 107. The sampled values yt of the analog reproduction signal are supplied to the BM 104 of the Viterbi detector 103. The BM 104 calculates a BM value that is a difference between each of the sampled values yt supplied thereto and an expected value. The expected value is a value depending on a PR waveform, and is a value that the analog reproduction signal could essentially assume. The BM value is calculated for each expected value when each one of the sampled values yt is supplied.

Hereinbelow, a description will be given, in order to facilitate the understanding of the invention, of examples of PR (1,1) having three values and four states with a D-restriction, focusing on RLL (1,7) code, to which the present invention is not limited. It is noted that two sorts of the states can be omitted due to the D-restriction of the RLL (1,7) code. This is based on that an RZ signal having a fine pattern of "1010101010 . . . " is, due to the D-restriction of the RLL (1,7) code, converted into an NRZ signal having a pattern of "1100110011 . . . " in which the states of "010" and "101" are eliminated. Specifically, BM values BM2 and BM5 are eliminated.

In the above-mentioned case, the four possible states are S0 (0,0), S1 (0,1), S2 (1,0) and S3 (1,1). The six possible expected values are P0, P1, P3, P4, P6 and P7. The BM 104 calculates BM values BM0, BM1, BM3, BM4, BM6 and BM7 that are differences between the sampled value yt and the expected values P0, P1, P3, P4, P6 and P7, by using the following expressions (1) to (6).

$$BM0 = |yt - P0| \quad (1)$$

$$BM1 = |yt - P1| \quad (2)$$

$$BM3 = |yt - P3| \quad (3)$$

$$BM4 = |yt - P4| \quad (4)$$

$$BM6 = |yt - P6| \quad (5)$$

$$BM7 = |yt - P7| \quad (6)$$

The BM 104 supplies the ACS 105 with the BM values BM0, BM1, BM3, BM4, BM6 and BM7 calculated by using the expressions (1) to (6). The ACS 105 adds the BM values BM0, BM1, BM3, BM4, BM6 and BM7 to PM values PM0 to PM3 of one clock before, which are stored in the PMM 106, according to merge conditions, and calculates such that the PM values PM0 to PM3 are integrated values of the minimum BM values BM0, BM3, BM4, BM6 and BM7 by using the following expressions (7) to (10).

$$PM0(t) = \min[BM0 + PM0(t-1), BM1 + PM1(t-1)] \quad (7)$$

$$PM1(t) = BM3 + PM3(t-1) \quad (8)$$

$$PM2(t) = BM4 + PM0(t-1) \quad (9)$$

$$PM3(t) = \min[BM6 + PM2(t-1), BM7 + PM3(t-1)] \quad (10)$$

Selecting the smaller PM value in this way means selecting a state-transition pass. That is, the ACS 105 always selects a state-transition pass with the minimum PM value. Namely, the ACS 105 supplies the PM 107 with data (binary data) corresponding to the selected passes.

It is noted that BM0+PM0(t−1) of PM0(t) corresponds to a transition from the state S0 to the state S0, and BM1+PM1(t−1) of PM0(t) corresponds to a transition from the state S1 to the state S0. In addition, BM6+M2(t−1) of PM3(t) corresponds to a transition from the state S2 to the state S3, and BM7+PM3(t−1) of PM3(t) corresponds to a transition from the state S3 to the state S3.

There are four conditions represented by the following expressions (11) to (14) regarding relations among the elements in PM0(t) of the above expression (7) and PM3(t) of the above expression (10).

$$BM0 + PM0(t-1) < BM1 + PM1(t-1)] \quad (11)$$

$$BM0 + PM0(t-1) \geq BM1 + PM1(t-1)] \quad (12)$$

$$BM6 + PM2(t-1) < BM7 + PM3(t-1)] \quad (13)$$

$$BM6 + PM2(t-1) \geq BM7 + PM3(t-1)] \quad (14)$$

The merge conditions produced by combinations of these four conditions are classified into four groups as shown in FIG. 5. FIG. 5 is an illustration for explaining examples of the merge conditions produced by the combinations of the conditions.

FIG. 5 shows a classification of a combination (1) of conditions fulfilling the expressions (11) and (13), a combination (2) of conditions fulfilling the expressions (12) and (13), a combination (3) of conditions fulfilling the expressions (11) and (14), and a combination (4) of conditions fulfilling the expressions (12) and (14), and also shows thereunder a trellis diagram of merge conditions produced by the combinations of the conditions. FIG. 5 also shows the merge conditions produced by the combinations of the conditions, in other words, values of data D0 to data D3 corresponding to the selected passes.

For example, the data D0=0 corresponds to a pass from the state S0 to the state S0, the data D0=1 corresponds to a pass from the state S1 to the state S0, the data D1=1 corresponds to a pass from the state S3 to the state S1, the data D2=0 corresponds to a pass from the state S0 to the state S2, the data D3=0 corresponds to a pass from the state S2 to the state S3, and the data D3=1 corresponds to a pass from the state S3 to the state S3.

Figure 6:
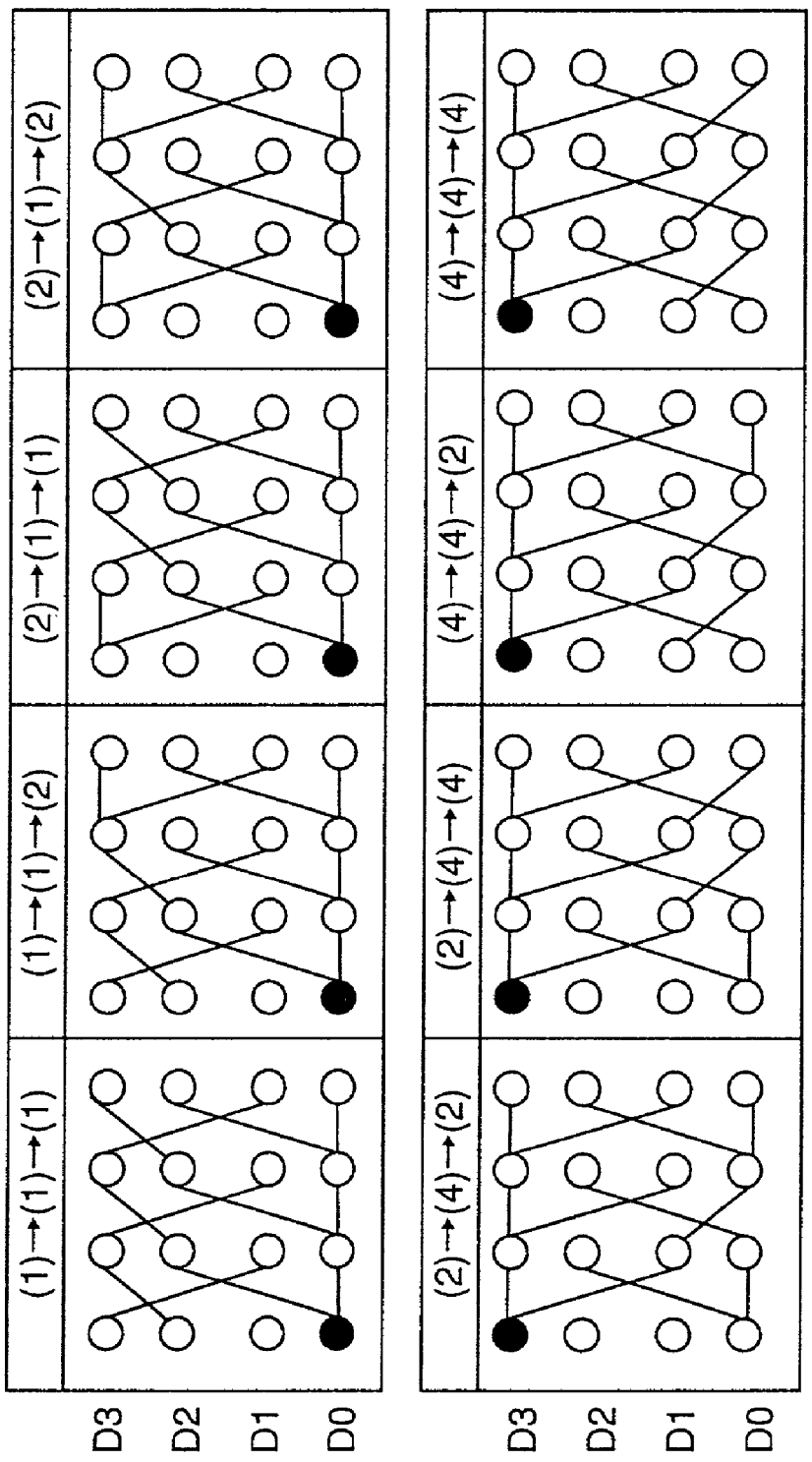
FIG. 6 is an illustration for explaining examples of pass merges.

At least three out of the four groups of the merge conditions produced by the combinations (1) to (4) can be combined into eight groups of pass merges as shown in FIG. 6. FIG. 6 is an illustration for explaining examples of pass merges.

FIG. 6 shows combinations of the merge conditions produced by three out of the combinations (1) to (4) shown in FIG. 5 and eight groups of pass merges according to the combinations of the merge conditions. It is noted that a mark "●" in FIG. 6 indicates that a pass is fixed to the corresponding state. For example, in a pass merge according to a combination (1)→(1)→(1) of the merge conditions, a pass is fixed to a state indicated by the mark "●" due to a continuity of the passes.

The PM 107 shifts the above-mentioned supplied data corresponding to each of the selected passes one by one, and in this course, weeds out data corresponding to each of unselected passes one by one. Then, the PM 107 outputs data corresponding to the surviving pass as a demodulated signal.

Figure 7:
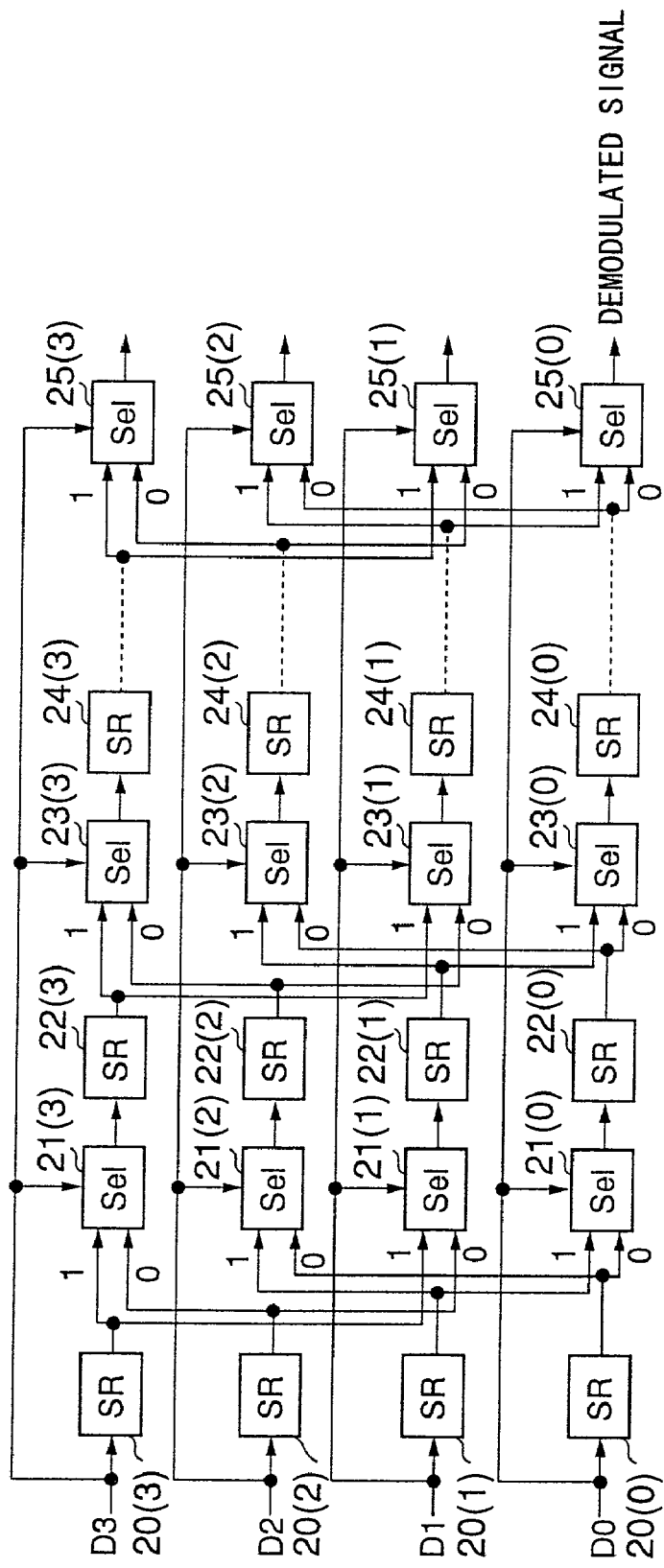
FIG. 7 shows an example of a structure of a pass memory.

FIG. 7 shows an example of a structure of the pass memory. The pass memory (PM) 107 shown in FIG. 7 is supplied with the data D0 to the data D3 corresponding to the selected passes from the ACS 105. It is noted that values of the data D0 to the data D3 are determined according to the merge conditions shown in FIG. 5. The PM 107 shown in FIG. 7 comprises shift registers 20(0) to 20(3), selectors 21(0) to 21(3), shift registers 22(0) to 22(3), selectors 23(0) to 23(3), shift registers 24(0) to 24(3), ..., selectors 25(0) to 25(3) arranged in parallel corresponding to the data D0 to the data D3, respectively. That is, the shift registers and the selectors are arranged alternately, in which the selectors select data to be supplied to the shift registers from among the data D0 to the data D3.

For example, when "1" is supplied to the data D3, the pass from the state S3 to the state S3 is judged to be likely according to the merge conditions shown in FIG. 5 so that all of the shift registers corresponding to the data D3 regard the data D3 at the time (t−1) as data at the time (t). On the other hand, when "0" is supplied to the data D3, the pass from the state S2 to the state S3 is judged to be likely according to the state transitions shown in FIG. 5 so that all of the shift registers corresponding to the data D3 regard the data D2 at the time (t−1) as data at the time (t).

Each of the shift resisters and the selectors performs these operations so that likely passes are left, and at the occurrence of the pass merges shown in FIG. 6, only the most likely pass is left. That is, after the occurrence of the pass merges shown in FIG. 6, the shift registers corresponding to each of the data D0 to the data D3 have the same data. Therefore, when the PM 107 has a sufficient number of stages, data has to be output as a demodulated signal only from any one of the shift registers corresponding to each of the data D0 to the data D3. It should be noted that the data D1 is always supplied with "1", and that the data D2 is always supplied with "0", as shown in FIG. 5. This is due to the D-restriction of the RLL (1,7) code. Hereinbelow, the data D0 to the data D3 supplied from the ACS 105 are referred to as soft judgment results.

The automatic expected-value follower 10 comprises a shift register 11, a pass-merge absolute-condition detector 12, an AND circuit 13, and a respective-expected-value calculator 14. It should be noted that the respective-expected-value calculator 14 functions as a follower following a fluctuation amount of a direct current component of the reproduction signal. The pass-merge absolute-condition detector 12 is supplied with the data D0 and the data D3 among the soft judgment results. The pass-merge absolute-condition detector 12 restricts the conditions on which pass merges occur.

Specifically, when the sampled value supplied from the digital equalizer 102 via the shift register 11 is a peak value or a bottom value, the pass-merge absolute-condition detector 12 produces judgment signals merge1 and merge0 from the data D0 and the data D3, the judgment signals merge1 and merge0 judging whether the sampled value indicates the peak or the bottom.

The judgment signals merge1 and merge0 invalidate the judgment signals merge1 and merge0 themselves with respect to parts 30 in which the data D0 and the data D3 simultaneously change. This is because the parts in which the data D0 and the data D3 simultaneously change are highly likely to be edges. In addition, parts encircled by ellipses 31 and 32 are made to be the expected values of the Viterbi demodulation through averaging.

Figure 8:
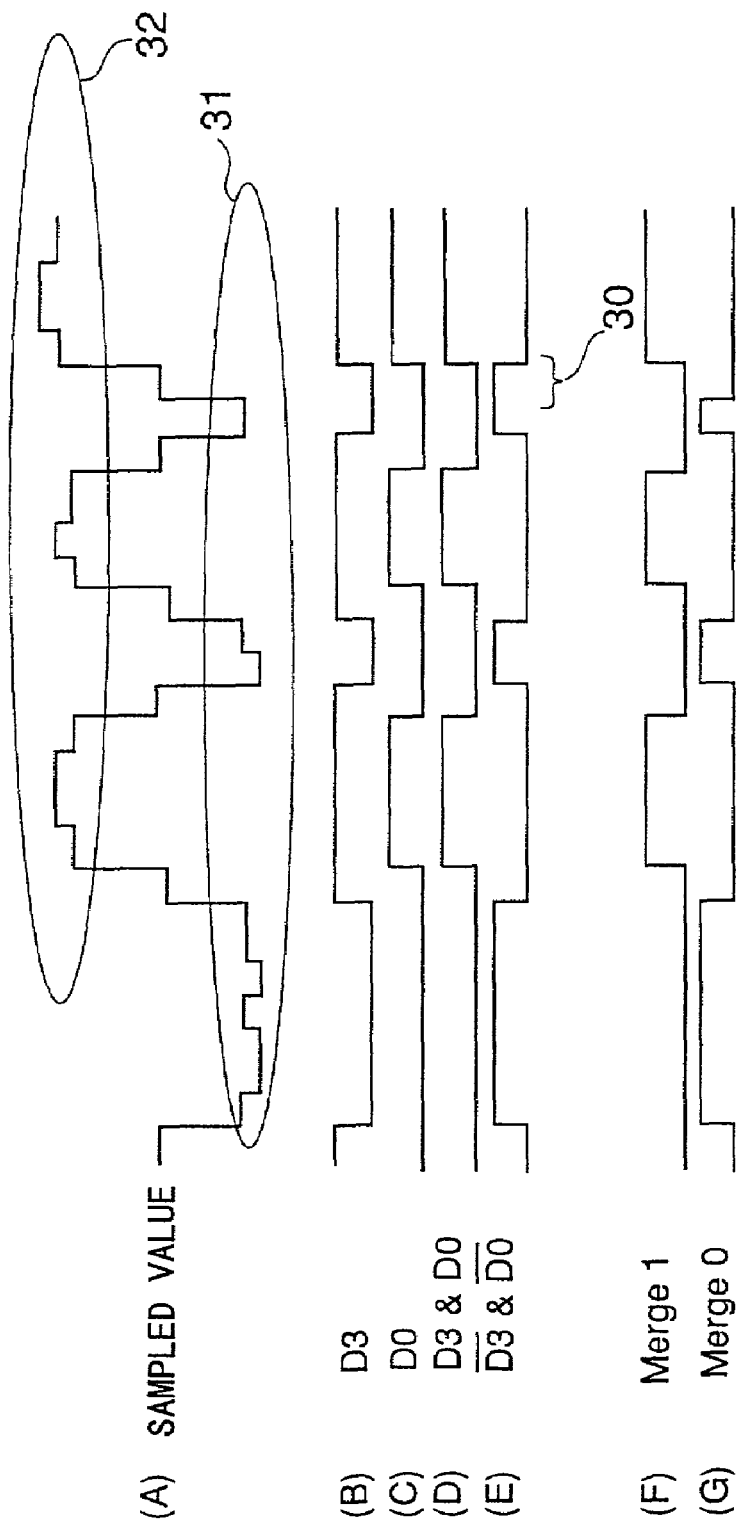
FIG. 8 is a timing diagram of an example of a pass-merge absolute-condition detector.
Figure 9:
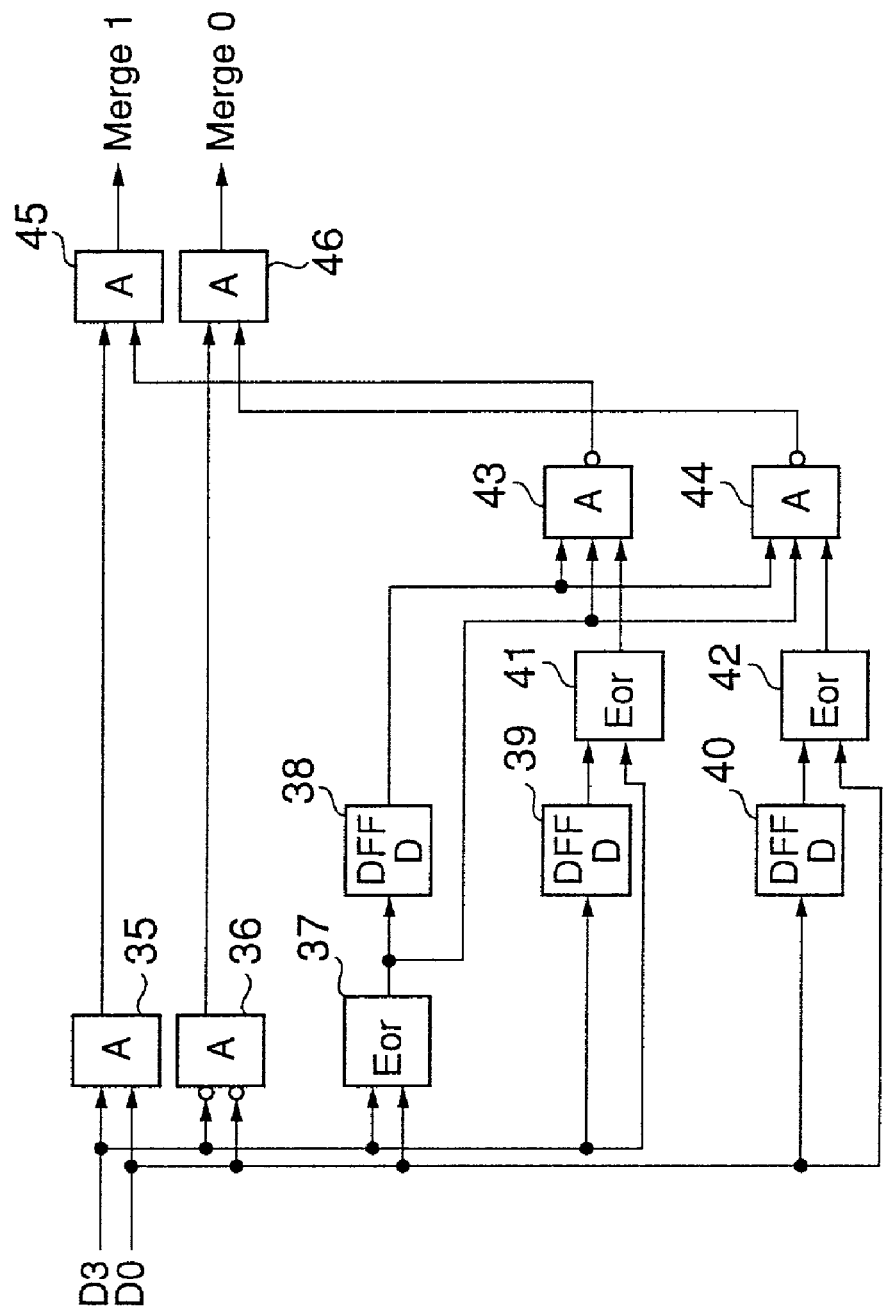
FIG. 9 shows an example of a structure of the pass-merge absolute-condition detector.

FIG. 9 shows an example of a structure of the pass-merge absolute-condition detector. For example, the data D3 indicated by FIG. 8-(B) is supplied to an AND circuit 35, a negative logic AND circuit 36, an EOR circuit 37, a D-type flip-flop circuit (hereinafter referred to as a DFF) 39, and an EOR circuit 41. The data D0 indicated by FIG. 8-(C) is supplied to the AND circuit 35, the negative logic AND circuit 36, the EOR circuit 37, a DFF 40, and an EOR circuit 42.

The AND circuit 35 calculates a logical product of the data D3 and the data D0, and then supplies data D3&D0 as indicated by FIG. 8-(D) to one terminal of an AND circuit 45. The negative logic AND circuit 36 calculates a negative-logical product of the data D3 and the data D0, and then supplies data /D3&/D0 as indicated by FIG. 8-(E) to one terminal of an AND circuit 46.

The EOR circuit 37 and a DFF 38 detect that the present data D3 and the present data D0 are different and that the previous data D3 and the previous data D0 are different, and then supplies the results to NAND circuits 43 and 44. That is, the EOR circuit 37 and the DFF 38 detect that the data D3 and the data D0 are different on the basis of two states.

The DFF 39 and the EOR circuit 41 detect that the present data D3 and the previous data D3 are different, and then supplies the result to the NAND circuit 43. That is, the DFF 39 and the EOR circuit 41 detect an edge of the data D3. The DFF 40 and the EOR circuit 42 detect that the present data D0 and the previous data D0 are different, and then supplies the result to the NAND circuit 44. That is, the DFF 40 and the EOR circuit 42 detect an edge of the data D0.

The NAND circuit 43 detects that the data D3 changes from "1" to "0", and then supplies the detection result to the other terminal of the AND circuit 45. The NAND circuit 44 detects that the data D0 changes from "0" to "1", and then supplies the detection result to the other terminal of the AND circuit 46.

Accordingly, the AND circuit 45 outputs the judgment signal merge1 indicated by FIG. 8-(F), for example. The AND circuit 46 outputs the judgment signal merge0 indicated by FIG. 8-(G), for example.

FIG. 8 shows that, when the judgment signal merge0 is at a high level, the sampled value indicated by FIG. 8-(A) is a bottom value, and that, when the judgment signal merge1 is at a high level, the sampled value indicated by FIG. 8-(A) is a peak value. The pass-merge absolute-condition detector 12 supplies the judgment signals merge1 and merge0 to the AND circuit 13. The AND circuit 13 is supplied with the sampled values from the digital equalizer 102 via the shift register 11.

Accordingly, the AND circuit 13 judges from the judgment signals merge1 and merge0 whether the sampled value indicates the peak or the bottom, and then supplies the judgment result to the respective-expected-value calculator 14. The respective-expected-value calculator 14 calculates a bottom value, a peak value and a center value, for example, and then uses the bottom value, the peak value and the center value to determine each of the expected values P0 to P7. Each of the expected values P0 to P7 determined herein is fed back to the Viterbi detector 103.

Figure 10:
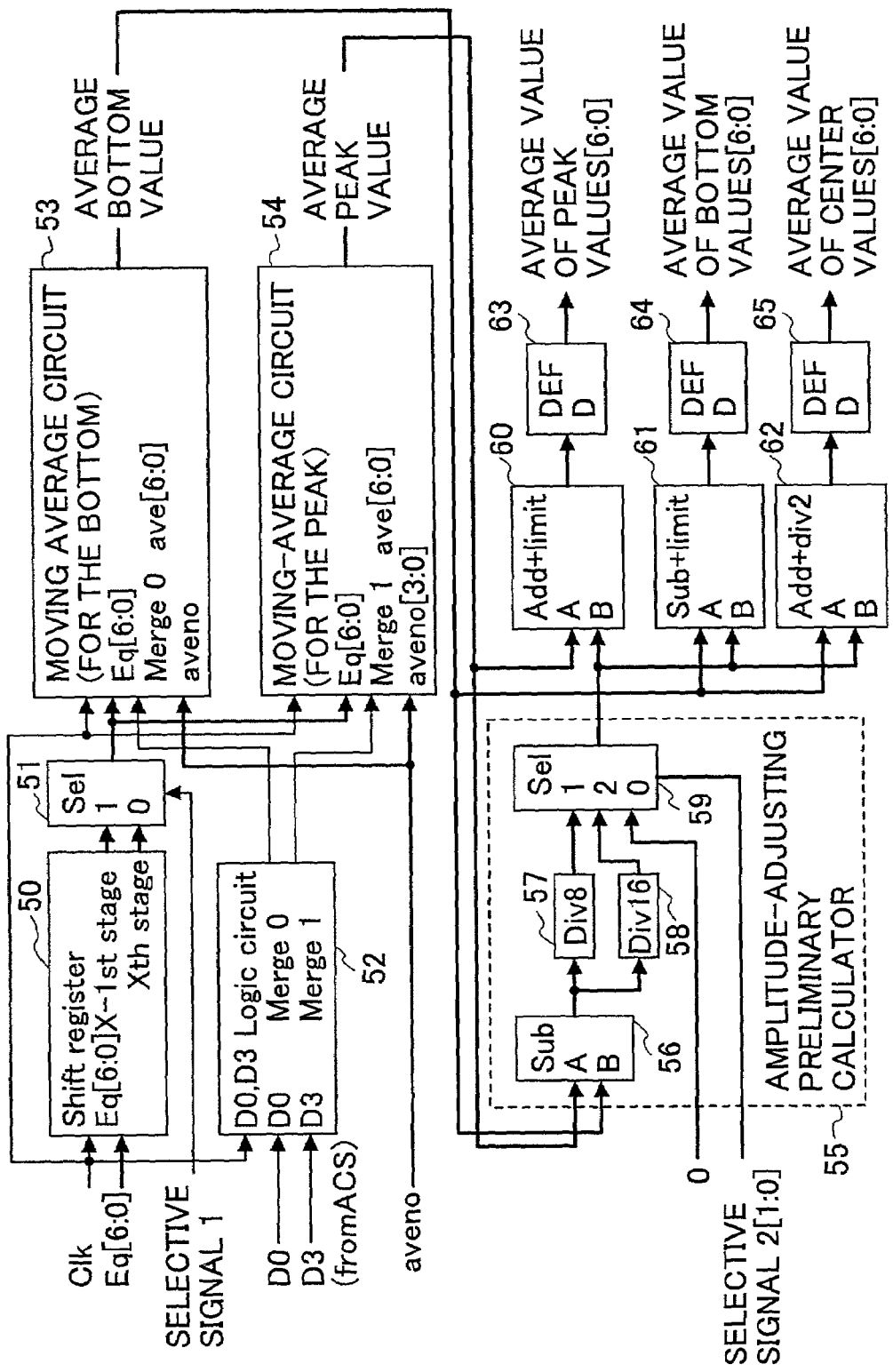
FIG. 10 is an illustration for explaining an example of an operation of an automatic expected-value follower.

FIG. 10 is an illustration for explaining an example of an operation of the automatic expected-value follower. It is noted that FIG. 10 shows elements and parts necessary for explaining an operation of the automatic expected-value follower, leaving out elements and parts unnecessary for the explanation. It is also noted that the clock signal is supplied to each circuit that needs it.

In FIG. 10, a shift register 50 is supplied with the sampled value as indicated by FIG. 8-(A), and then supplies a selector 51 with the sampled value adjusted in timing with the judgment signals merge1 and merge0 such as indicated by FIG. 8-(F) and FIG. 8-(G). In FIG. 10, the shift register 50 supplies the selector 51 with the sampled value adjusted in timing according to, for example, PR (1,1,0) or PR (0,1,1). The shift register 50 is also adaptable to a magneto-optical disk having an ID unit and a MO unit that have different data frequencies.

The selector 51 is supplied with a selective signal 1 that selects either PR (1,1,0) or PR (0,1,1), and then supplies moving-average circuits 53 and 54 with the sampled value adjusted to the timing of PR (1,1,0) or PR (0,1,1) according to the selective signal 1.

A D0/D3 logic circuit 52 as a pass-merge absolute-condition detector is supplied with the data D0 and D3 from the ACS 105, and then produces the judgment signals merge1 and merge0 from the data D0 and the data D3, as mentioned above. The D0/D3 logic circuit 52 supplies the judgment signal merge0 to the moving-average circuit 53, and supplies the judgment signal merge1 to the moving-average circuit 54.

The moving-average circuit 53 uses the judgment signal merge0 indicating the bottom value of the sampled value to calculate an average bottom value of the part encircled by the ellipse 31 shown in FIG. 8, for example, by using the following expression (15).

$$\text{Average}(t)=[\text{average}(t-1)\times(n-1)+\text{sampled value}]/n \quad (15)$$

In this expression, n is a number of the averaged samples, and is referred to as an averaging number (aveno). It is noted that the moving-average circuit 53 calculates the average value when the judgment signal merge0 is at a high level, i.e., when the sampled value marks the bottom value.

The moving-average circuit 54 uses the judgment signal merge1 indicating the peak value of the sampled value to calculate an average peak value of the part encircled by the ellipse 32 shown in FIG. 8, for example, by using the above expression (15). The moving-average circuit 54 calculates the average value when the judgment signal merge1 is at a high level, i.e., when the sampled value marks the peak value.

The average bottom value is supplied from the moving-average circuit 53 to an amplitude-adjusting preliminary calculator 55, a subtracting and limiting circuit 61, and an adding and dividing circuit 62. The average peak value is supplied from the moving-average circuit 54 to the amplitude-adjusting preliminary calculator 55, an adding and limiting circuit 60, and the adding and dividing circuit 62. The amplitude-adjusting preliminary calculator 55 comprises a subtracter 56, a divider 57, a divider 58, and a selector 59.

The subtracter 56 calculates an amplitude value from the difference between the average peak value and the average bottom value, and then supplies the amplitude value to the divider 57 and the divider 58. The divider 57 divides the amplitude value by 8, and then supplies the divided amplitude value to the selector 59. The divider 58 divides the amplitude value by 16, and then supplies the divided amplitude value to the selector 59. The selector 59 supplies either of the amplitude value divided by 8, the amplitude value divided by 16, and 0 according to a selective signal 2 to the adding and limiting circuit 60, the subtracting and limiting circuit 61 and the adding and dividing circuit 62.

The adding and limiting circuit 60 adds the average peak value and the value supplied from the selector 59, adjusts an upper limit of a bit width thereof, and then outputs the adjusted value to a DFF 63. The DFF 63 outputs the value supplied from the adding and limiting circuit 60 as an average value of the peak values. The subtracting and limiting circuit 61 subtracts the value supplied from the selector 59 from the average bottom value, adjusts an lower limit of a bit width thereof, and then outputs the adjusted value to a DFF 64. The DFF 64 outputs the value supplied from the subtracting and limiting circuit 61 as an average value of the bottom values. The adding and dividing circuit 62 adds the average bottom value and the value supplied from the selector 59, divides the added value by 2, and then outputs the divided value to a DFF 65. The DFF 65 outputs the value supplied from the adding and dividing circuit 62 as an average value of the center values. These bottom value, peak value and center value can be used to determine each of the expected values P0 to P7.

Figure 11:
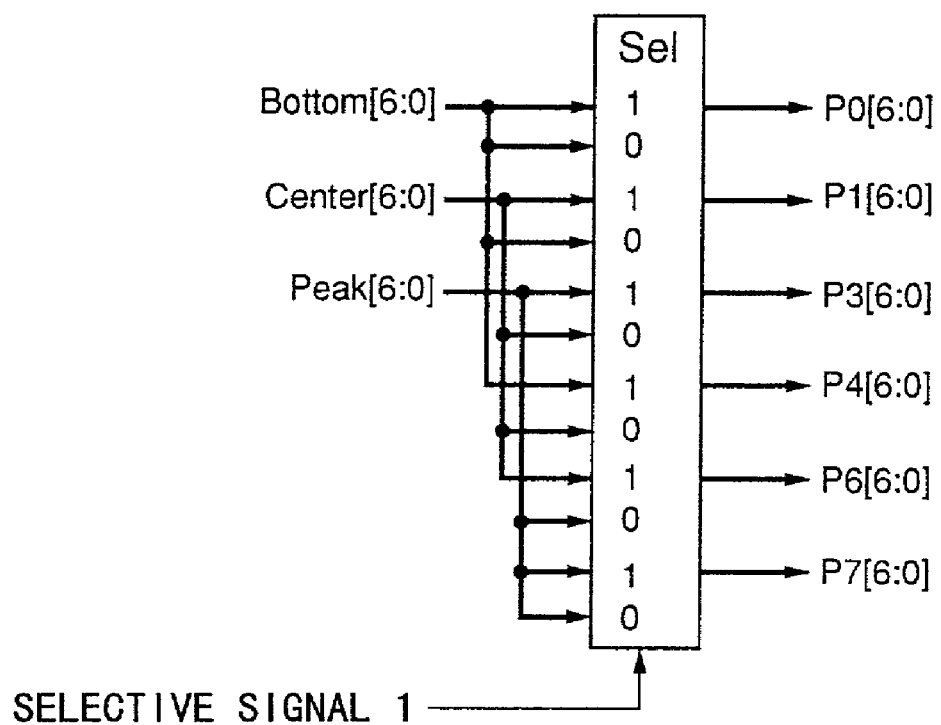
FIG. 11 shows an example of a structure of an automatic expected-value allocating circuit.

FIG. 11 shows an example of a structure of an automatic expected-value allocating circuit. The automatic expected-value allocating circuit shown in FIG. 11 is adaptable to PR (1,1,0) and PR (0,1,1), and outputs the expected values P0 to P7 for PR (1,1,0) or PR (0,1,1) according to the selective signal 1.

For example, the average value of the bottom values is supplied to terminals selecting the expected values P0, P1 and P4, the average value of the center values is supplied to terminals selecting the expected values P1, P3, P4 and P6, and the average value of the peak values is supplied to terminals selecting the expected values P3, P6 and P7.

FIG. 12 shows a structure of a data reproducing system according to another embodiment of the present invention. A data reproducing system 2 shown in FIG. 12 is identical to the data reproducing system shown in FIG. 4 except several elements and parts, and thus elements in FIG. 12 that are identical or equivalent to the elements shown in FIG. 4 are referenced by the same reference marks, and will not be described in detail.

In FIG. 12, the respective-expected-value calculator 14 supplies the center value to a subtracter 15. Aside from the center value, the subtracter 15 is supplied with a given value REG1 that is set arbitrarily by an MPU, etc. so as to detect an offset amount. The subtracter 15 supplies the difference between the center value and the given value REG1 to an adder 16 provided at a stage preceding the digital equalizer 102. Accordingly, the data reproducing system 2 shown in FIG. 12 is capable of canceling the offset amount included in a sampled value.

The present invention is not limited to the specifically disclosed embodiments, and variations and modifications may be made without departing from the scope of the present invention.

The present application is based on Japanese priority application No. 2001-063895 filed on Mar. 7, 2001, the entire contents of which are hereby incorporated by reference.

What is claimed is:

1. A data reproducing method for reproducing data corresponding to a state-transition pass selected as being most likely according to a Viterbi decoding algorithm from a reproduction signal supplied from a recording medium, the method comprising the steps of:

detecting at least one state of said reproduction signal according to data used for selecting said state-transition pass;

calculating an average value of said reproduction signal in each of said at least one state detected by said step of detecting;

determining at least one expected value according to said average value so as to allow the expected value to follow a fluctuation amount of a direct current component of said reproduction signal; and supplying said expected value to a Viterbi detector such that the expected value is used in said Viterbi decoding algorithm.

2. The data reproducing method as claimed in claim 1, wherein said step of detecting includes the steps of:

outputting data supplied to a pass memory of the Viterbi detector as said data used for selecting said state-transition pass; and producing a state signal indicating said state according to said data used for selecting said state-transition pass.

3. The data reproducing method as claimed in claim 2, wherein said step of calculating includes the steps of:

judging said state according to said state signal; and calculating the average value of said reproduction signal in said state judged by said step of judging.

4. The data reproducing method as claimed in claim 1, wherein said step of following includes the steps of:

determining at least one expected value according to said average value, the expected value being used in said Viterbi decoding algorithm; and supplying said expected value to the Viterbi detector.

5. The data reproducing method as claimed in claim 1, wherein said step of following includes the step of:

adjusting the fluctuation amount of the direct current component according to said average value.

6. The data reproducing method as claimed in claim 1, wherein said state is one of a peak portion, a center portion and a bottom portion of said reproduction signal.

7. A data reproducing device for reproducing data corresponding to a state-transition pass selected as being most likely according to a Viterbi decoding algorithm from a reproduction signal supplied from a recording medium, the device comprising:

a condition detector detecting at least one state of said reproduction signal according to data used for selecting said state-transition pass;

an average circuit calculating an average value of said reproduction signal in each of said at least one state detected by said condition detector; and a follower, wherein said follower determines at least one expected value according to said average value so as to allow the expected value to follow a fluctuation amount of a direct current component of said reproduction signal, the expected value being used in said Viterbi decoding algorithm, so as to supply said expected value to a Viterbi detector.

8. The data reproducing device as claimed in claim 7, wherein said condition detector is supplied with data supplied to a pass memory of the Viterbi detector as said data used for selecting said state-transition pass so as to produce a state signal indicating said state according to said data used for selecting said state-transition pass.

9. The data reproducing device as claimed in claim 8, wherein said average circuit judges said state according to said state signal so as to calculate the average value of said reproduction signal in said state.

10. The data reproducing device as claimed in claim 7, wherein said follower adjusts the fluctuation amount of the direct current component according to said average value.

11. The data reproducing device as claimed in claim 7, wherein said state is one of a peak portion, a center portion and a bottom portion of said reproduction signal.

12. A magneto-optical disk device for reproducing data according to a state-transition pass selected as being most likely according to a Viterbi decoding algorithm from a reproduction signal supplied from a recording medium having data recorded according to a partial-response waveform, the device comprising:

a condition detector detecting at least one state of said reproduction signal according to data used for selecting said state-transition pass, the data being supplied from a Viterbi detector;

an average circuit calculating an average value of said reproduction signal in each of said at least one state detected by said condition detector; and a follower, wherein said follower determines at least one expected value according to said average value so as to allow the expected value to follow a fluctuation amount of a direct current component of said reproduction signal, the expected value being used in said Viterbi decoding algorithm, so as to supply said expected value to a Viterbi detector.

13. The data reproducing method as claimed in claim 1, wherein said at least one state includes a peak value, a center value, and a bottom value of the reproduction signal.

14. The data reproducing device as claimed in claim 7, wherein said at least one state includes a peak value, a center value, and a bottom value of the reproduction signal.

15. The magneto-optical disk device as claimed in claim 12, wherein said at least one state includes a peak value, a center value, and a bottom value of the reproduction signal.

* * * * *